(12) United States Patent
Doi

(10) Patent No.: US 8,140,940 B2
(45) Date of Patent: Mar. 20, 2012

(54) METHOD AND APPARATUS FOR CONTROLLING MEMORY

(75) Inventor: Masanori Doi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 902 days.

(21) Appl. No.: 12/222,054

(22) Filed: Jul. 31, 2008

(65) Prior Publication Data

US 2008/0301528 A1 Dec. 4, 2008

Related U.S. Application Data

(63) Continuation of application No. PCT/JP2006/303474, filed on Feb. 24, 2006.

(51) Int. Cl.
*G06F 11/00* (2006.01)
(52) U.S. Cl. .................. 714/764; 714/824
(58) Field of Classification Search .............. 714/764, 714/763, 766, 768, 819, 821, 824
See application file for complete search history.

(56) References Cited

U.S. PATENT DOCUMENTS

| | | | |
|---|---|---|---|
| 5,392,301 A | | 2/1995 | Fukushima |
| 5,793,774 A | * | 8/1998 | Usui et al. .................. 714/719 |
| 6,971,053 B1 | * | 11/2005 | Smith .......................... 714/723 |
| 7,283,380 B1 | * | 10/2007 | Srinivasan et al. ......... 365/49.17 |
| 7,793,082 B2 | * | 9/2010 | Bull et al. ................... 712/220 |
| 2004/0123264 A1 | * | 6/2004 | Tsai et al. ..................... 716/19 |

FOREIGN PATENT DOCUMENTS

| | | |
|---|---|---|
| JP | 61-226853 | 10/1986 |
| JP | 1-123345 | 5/1989 |
| JP | 2-177099 | 7/1990 |
| JP | 4-343154 | 11/1992 |
| JP | 6-325595 | 11/1994 |
| JP | 7-84889 | 3/1995 |

OTHER PUBLICATIONS

International Search Report of International Application No. PCT/JP2006/303474, mailing date of Apr. 4, 2006.
Japanese Office Action issued Mar. 22, 2011 in corresponding Japanese Patent Application 2008-501550.

* cited by examiner

*Primary Examiner* — Dieu-Minh Le
(74) *Attorney, Agent, or Firm* — Staas & Halsey LLP

(57) ABSTRACT

A memory control apparatus includes a reading unit, an inserting unit, an identifying unit, a determining unit, and an outputting unit. The reading unit reads data from the memory. The inserting unit inserts a dummy error at an insertion position in the data thereby obtaining error data. The identifying unit identifies an error position at which an error has occurred in the error data. The determining unit determines whether the insertion position matches the error position. When the insertion position matches the error position, the outputting unit outputs corrected data obtained by correcting an error at the error position.

11 Claims, 4 Drawing Sheets

METHOD AND APPARATUS FOR CONTROLLING MEMORY

CROSS REFERENCE TO RELATED APPLICATIONS

The present application is a continuation filed under 35 U.S.C. §111(a), of PCT International Application No. PCT/JP2006/303474, which has an International filing date of Feb. 24, 2006 and designated the United States of America, the disclosure of which is hereby incorporated by reference.

BACKGROUND OF THE INVENTION

1. Field of the Invention

The present invention relates to a method and apparatus for controlling a memory.

2. Description of the Related Art

With the progress in the miniaturization and the high-speed in the field of semiconductor technologies, smaller memory elements have been used in random access memories (RAMs) mounted on a processor, such as central processing units (CPUs). Such a smaller memory element, however, may cause a failure, such as bit inversion, in data stored in the RAM. As one of approaches to automatically take an action in response to such a failure, researchers have studied about a reliability, availability, and serviceability control (RAS control).

An error correction technique by using an error correcting code (ECC), for example, plays an important role in the RAS control. In a typical error correction technique, an error correcting circuit corrects an error in data, such as bit inversion, by using the ECC added to the data. Such error correction is performed on the assumption that the error correcting circuit is normal. Therefore, it is necessary to guarantee reliability of the error correcting circuit.

In an approach to verify whether the error correcting circuit is normal, data including an error is intentionally written to the RAM. If the error correcting circuit detects the error from the data, the error correcting circuit is determined to be normal. For example, in a conventional technology disclosed in Japanese Patent Application Laid-open No. H07-84889, the data is written to a first address of the RAM, and the error data is written to a second address that is obtained by inverting the first address. Whether the error correcting circuit is normal is determined by using the error data written to the second address.

In the conventional technology, however, the error data is generated intentionally only when the data is written to the RAM. Therefore, if the RAM is used as a cache memory in a CPU, the reliability of the error correcting circuit is not always guaranteed because, for example, the error data may be overwritten with new data without being read from the RAM. Specifically, to verify the validity of the error correcting circuit, an error is generated in the data to be written to the RAM, and then the error data is written to the RAM. When a read command is issued to read the error data, the error correction is performed on the error data, so that it is possible to determine whether the error is properly detected and corrected. However, if the error data is overwritten with new data without being read from the RAM, the new data is read from the RAM instead of the error data.

If there is a relatively long interval between when the error data is written to the cache memory and when the error data is read from the cache memory, checking of the error correcting circuit is not always conducted regularly. As a result, the reliability of the error correcting circuit is not always guaranteed.

SUMMARY

It is an object of the present invention to at least partially solve the problems in the conventional technology.

According to an aspect of the present invention, there is provided a memory control apparatus that controls input and output of data in a memory. The memory control apparatus includes a reading unit that reads data from the memory; an inserting unit that inserts a dummy error at an insertion position in the data thereby obtaining error data; an identifying unit that identifies an error position at which an error has occurred in the error data; a determining unit that determines whether the insertion position matches the error position; and an outputting unit that, when the insertion position matches the error position, outputs corrected data that is obtained by correcting an error at the error position in the error data.

According to another aspect of the present invention, there is provided a memory control method that controls input and output of data in a memory. The memory control method includes reading data from the memory; inserting a dummy error at an insertion position in the data thereby obtaining error data; identifying an error position at which an error has occurred in the error data; determining whether the insertion position matches the error position; and outputting, when the insertion position matches the error position, corrected data that is obtained by correcting an error at the error position in the error data.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention are explained in detail below with reference to the accompanying drawings. Although a CPU in the following embodiments includes a single cache memory, it is allowable to use a CPU including two or more cache memories. If there are two or more cache memories, it is possible to verify the validity of an error correcting circuit corresponding to each of the cache memories.

Figure 1:
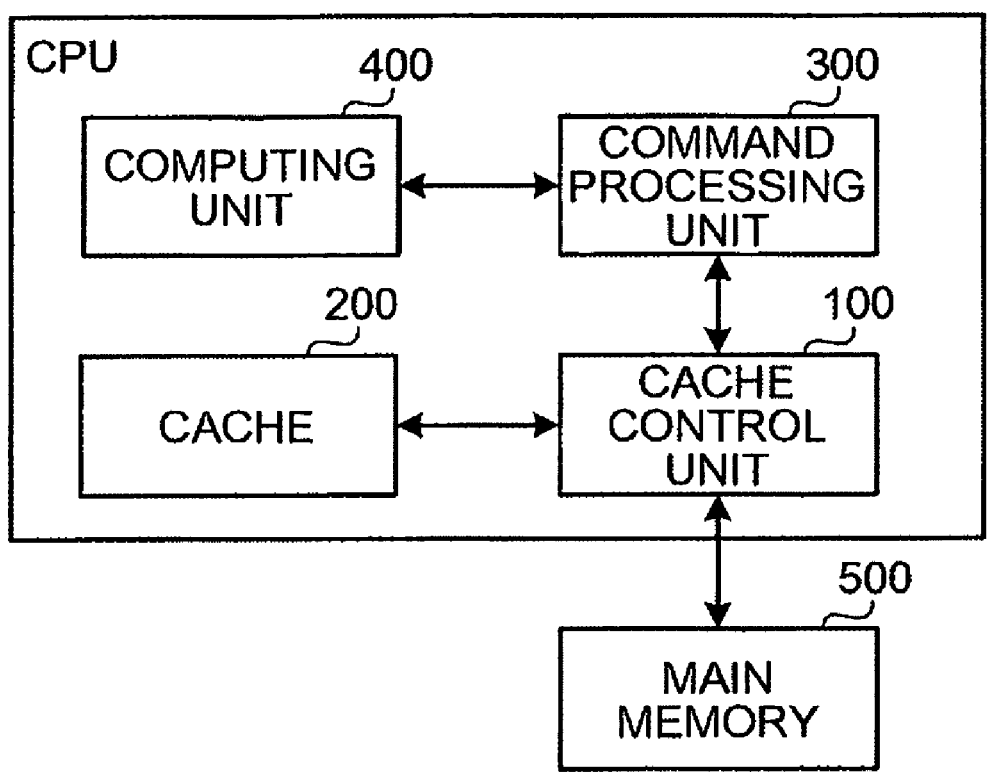
FIG. 1 is a block diagram of a CPU according to an embodiment of the present invention.

FIG. 1 is a block diagram of the CPU according to an embodiment of the present invention. The CPU includes a cache control unit 100, a cache 200, a command processing unit 300, and a computing unit 400. The CPU is connected to a main memory 500.

The cache control unit 100 controls writing/reading of data to/from the cache 200 in response to a command received from the command processing unit 300. The cache control unit 100 performs error correction on data read from the cache 200. The cache control unit 100 determines whether an error correcting circuit is normal. A specific configuration of the cache control unit 100 will be described later in detail.

The cache 200 stores therein data that is frequently used from among data stored in the main memory 500. The cache 200 also stores therein an ECC that is added to the stored data. Specifically, the cache 200 includes a data RAM that stores therein data, and an ECC RAM that stores therein the ECC. The cache 200 can include a tag RAM that stores therein tag data about the stored data.

The command processing unit 300 interprets a command for a computer program, or the like, and issues a command to the computing unit 400 to perform required computation. The command processing unit 300 issues a command to the cache control unit 100 to write/read required data to/from the cache 200. The computing unit 400 performs computation by using data read from the cache 200, or the like, in response to a command from the command processing unit 300.

The main memory 500 stores therein data and a computer program that are required for operation performed by the CPU. A capacity of the main memory 500 is larger than that of the cache 200, but an access rate of the main memory 500 is lower than that of the cache 200.

Figure 2:
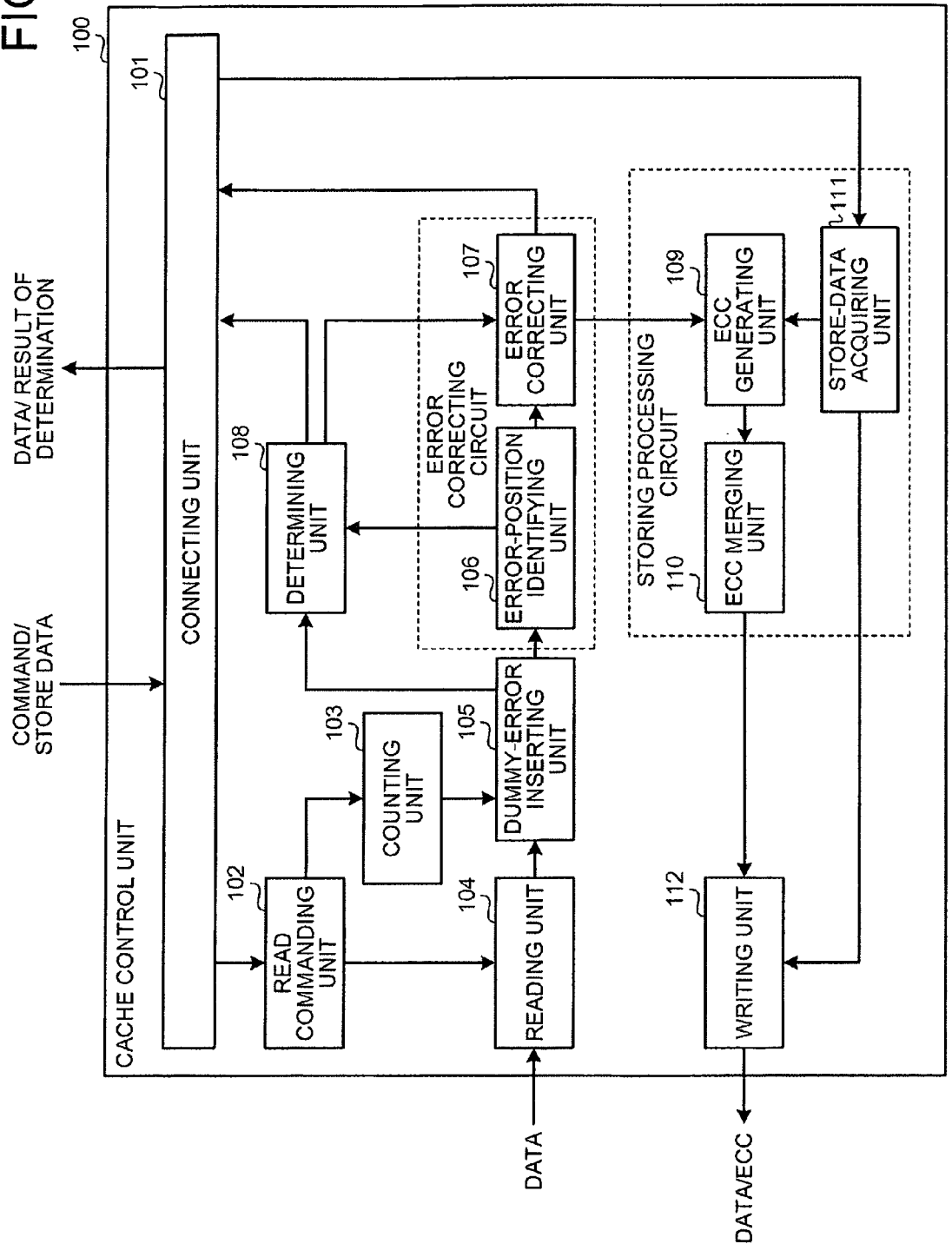
FIG. 2 is a block diagram of a relevant part of a cache control unit in the CPU.

FIG. 2 is a block diagram of a relevant part of the cache control unit 100. The cache control unit 100 includes a connecting unit 101, a read commanding unit 102, a counting unit 103, a reading unit 104, a dummy-error inserting unit 105, an error-position identifying unit 106, an error correcting unit 107, a determining unit 108, an ECC generating unit 109, an ECC merging unit 110, a store-data acquiring unit 111, and a writing unit 112.

The connecting unit 101 is connected to the command processing unit 300. The connecting unit 101 receives from the command processing unit 300 updated data to be stored in the cache 200 (hereinafter, "store data") and commands including a read command to read data from the cache 200 and a store command to store the store data in the cache 200. The connecting unit 101 notifies the read commanding unit 102 of the received command. The connecting unit 101 outputs data read from the cache 200, or a result of determination whether the error correcting circuit is normal to the command processing unit 300.

Upon receiving the read command, or the store command from the command processing unit 300, the read commanding unit 102 notifies the counting unit 103 of the read command and the store command, and notifies the reading unit 104 of an address of target data to be read.

The counting unit 103 counts the number of times that the counting unit 103 is notified of the read command by the read commanding unit 102. When the current count of the counting unit 103 reaches a threshold, the counting unit 103 issues a command to the dummy-error inserting unit 105 to insert a dummy error in data, and resets the count of the counting unit 103. When the counting unit 103 is notified of the store command by the read commanding unit 102, the counting unit 103 issues a command to the dummy-error inserting unit 105 to insert a dummy error in data at the second reading operation in the storing process. In the storing process, before the store data is stored in the cache 200, data that is not to be overwritten (hereinafter, "non-store target data") is read from the cache 200 (the first reading operation), and the read non-store target data is checked whether there is an error in it. If the non-store target data contains no error, the non-store target data is stored in the cache 200. Subsequently, the non-store target data is re-read from the cache 200 (the second reading operation), and then the ECC is generated by the ECC generating unit 109 from both the store data and the non-store target data. The counting unit 103 commands the dummy-error inserting unit 105 to insert a dummy error at the second reading operation.

The reading unit 104 reads from the cache 200 data at the address notified by the read commanding unit 102, and outputs the read data to the dummy-error inserting unit 105. Specifically, the reading unit 104 reads data at the address indicated by the read command issued by the command processing unit 300, or the non-store target data at an address indicated by the store command.

Upon receiving the command to insert the dummy error from the counting unit 103, the dummy-error inserting unit 105 inserts the dummy error in the data received from the reading unit 104. Specifically, the dummy-error inserting unit 105 inverts a predetermined bit in the data, thereby inserting the dummy error in the data. As described above, when the predetermined number of the read commands is issued, or the store command is issued, the counting unit 103 issues the command to the dummy-error inserting unit 105 to insert the dummy error. Therefore, at least the dummy-error inserting unit 105 inserts one dummy error in the data each time the predetermined number of the read commands is issued. The dummy-error inserting unit 105 notifies the determining unit 108 of an insertion position at which the dummy-error inserting unit 105 inserts the dummy error.

The error-position identifying unit 106 identifies an error position at which a bit error occurs by using the ECC added to the data, and notifies the error correcting unit 107 and the determining unit 108 of the identified error position.

Upon receiving a command to continue the error correction from the determining unit 108, the error correcting unit 107 inverts the bit at the error position notified by the error-position identifying unit 106, thereby correcting the error in the data. The error correcting unit 107 then outputs the corrected data to the connecting unit 101 or the ECC generating unit 109. Specifically, the error correcting unit 107 outputs the corrected data to the connecting unit 101 if the corrected data is resultant from the read command issued by the command processing unit 300. Alternatively, the error correcting unit 107 outputs corrected non-store target data to the ECC generating unit 109 if the corrected data is resultant from a storage command issued by the command processing unit 300. The error-position identifying unit 106 and the error correcting unit 107 work together as the error correcting circuit.

The determining unit 108 determines whether the insertion position in which the dummy-error inserting unit 105 inserts the dummy error matches the error position notified by the error-position identifying unit 106. If the insertion position matches the error position, the determining unit 108 determines that the error-position identifying unit 106 properly identifies the error position, and issues a command to the error correcting unit 107 to continue the error correction. If the insertion position does not match the error position, the determining unit 108 determines that the error-position identifying unit 106 is abnormal. The determining unit 108 then outputs information indicative of the error correcting circuit being abnormal to the connecting unit 101.

The ECC generating unit 109 generates the ECC of each of the non-store target data received from the error correcting unit 107 and the store data received from the store-data acquiring unit 111. The ECC generating unit 109 then outputs the generated ECCs to the ECC merging unit 110.

The ECC merging unit 110 merges the ECC of the non-store target data and the ECC of the store data, thereby generating a new ECC when a part of the data is overwritten in the storing process. The ECC merging unit 110 outputs the new ECC to the writing unit 112.

If the command processing unit 300 has issued the store command, the store-data acquiring unit 111 acquires the store data from the connecting unit 101, and outputs the acquired store data to the ECC generating unit 109 and the writing unit 112.

The ECC generating unit 109, the ECC merging unit 110, and the store-data acquiring unit 111 work together as a storing processing circuit according to the embodiment of the present invention.

The writing unit 112 receives the store data from the store-data acquiring unit 111, and writes the received store data in the cache 200. Furthermore, the writing unit 112 receives the new ECC from the ECC merging unit 110, and writes the received new ECC in the cache 200.

Figure 3:
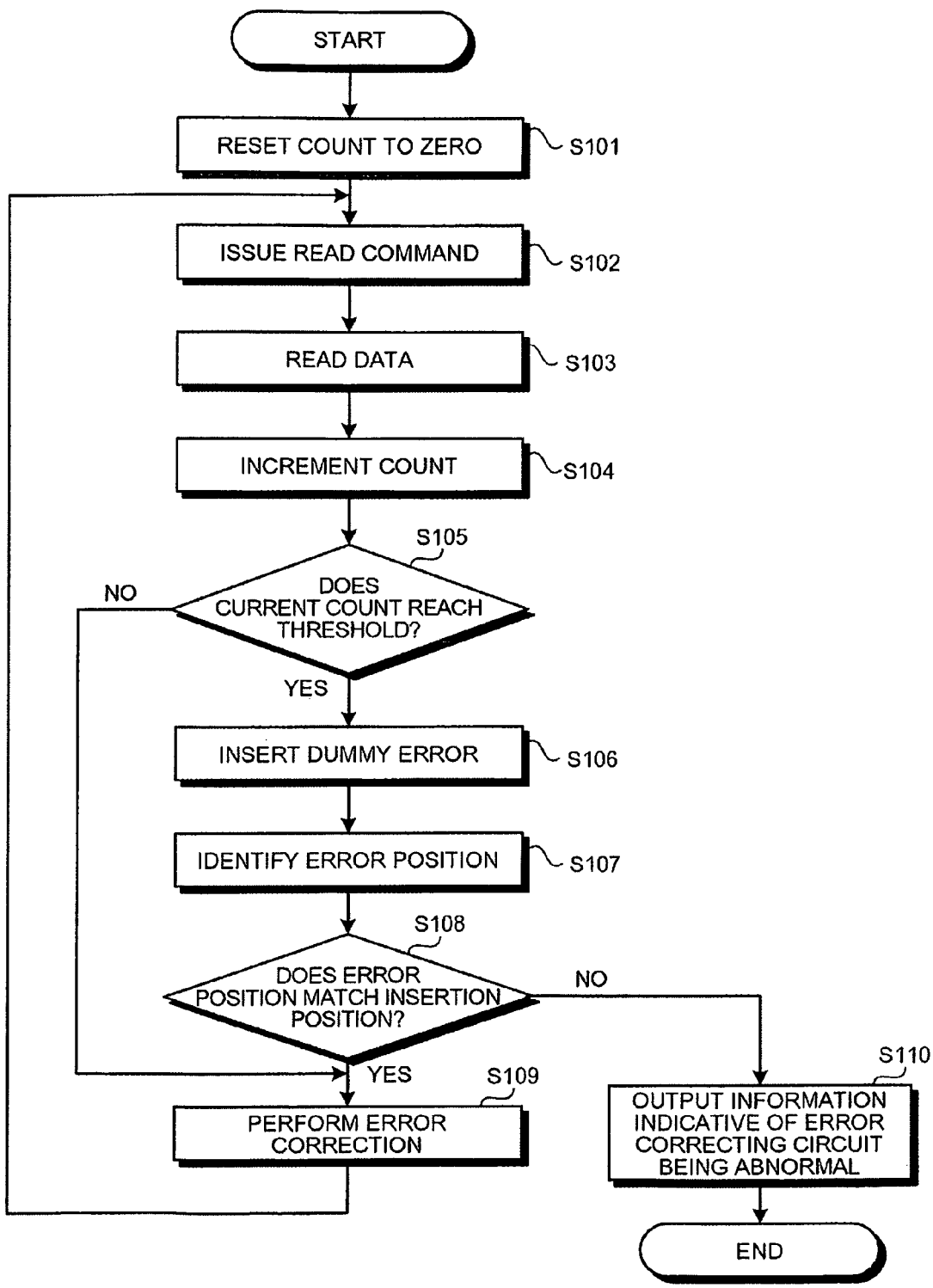
FIG. 3 is a flowchart of a reading process performed by the cache control unit.

FIG. 3 is a flowchart of a reading process performed by the cache control unit 100.

In a default state, the count of the counting unit 103 is reset to zero (Step S101). When the command processing unit 300 issues the read command to the cache control unit 100 (Step S102), the read command is input to the read commanding unit 102 via the connecting unit 101. The read commanding unit 102 then notifies the reading unit 104 of an address of data to be read, and notifies the counting unit 103 that the reading process is to be performed.

The reading unit 104 reads data at the address notified by the read commanding unit 102 from the cache 200 (Step S103). When the counting unit 103 is notified that the reading process is to be performed, the counting unit 103 increments the count by one (Step S104). After the counting unit 103 increments the count by one, the counting unit 103 determines whether the current count reaches a threshold (Step S105).

If the current count does not reach the threshold (No at Step S105), the data read from the cache 200 by the reading unit 104 is output to the error correcting circuit via the dummy-error inserting unit 105. If the data includes an error, the error-position identifying unit 106 detects an error position at which the error occurs in the data. The error correcting unit 107 then inverts a bit at the error position, thereby performing the error correction (Step S109). The corrected data is output to the command processing unit 300 via the connecting unit 101. Specifically, if the current count of the counting unit 103 does not reach the threshold, the error correction is performed and the reading process is performed on the assumption that the error correcting circuit is normal. After the reading process, the cache control unit 100 is in stand-by mode until receiving a subsequent read command from the command processing unit 300.

It is assumed that the command processing unit 300 issues a subsequent read command to the cache control unit 100 (Step S102). The read command is input to the read commanding unit 102 via the connecting unit 101. The reading unit 104 then reads data from the cache 200 in response to the command received from the read commanding unit 102 (Step S103). The counting unit 103 increments the count by one (Step S104). The counting unit 103 determines whether the current count reaches the threshold (Step S105).

If the current count of the counting unit 103 reaches the threshold (Yes at Step S105), the counting unit 103 issues a command to the dummy-error inserting unit 105 to insert a dummy error in the data. When the data read from the cache 200 by the reading unit 104 is output to the dummy-error inserting unit 105, the dummy-error inserting unit 105 inserts the dummy error in the data (Step S106). Specifically, the dummy-error inserting unit 105 inverts a predetermined bit in the data, thereby inserting the dummy error. The dummy-error inserting unit 105 notifies the determining unit 108 of an insertion position in which the dummy error is inserted by the dummy-error inserting unit 105.

As described above, the dummy-error inserting unit 105 inserts the dummy error in the data each time the current count of the counting unit 103 reaches the threshold, that is, each time the number of read commands issued by the command processing unit 300 reaches the predetermined number. In this manner, even if read commands are continuously issued by the command processing unit 300 and no store command is issued, it is possible to regularly verify the validity of the error correcting circuit, and to guarantee that the RAS control properly functions.

The dummy-error inserting unit 105 outputs the data in which the dummy error is inserted to the error-position identifying unit 106. The error-position identifying unit 106 then identifies an error position at which an error occurs in the data by using the ECC added to the data (Step S107). If the dummy-error inserting unit 105 inserts the dummy error in the data and the error-position identifying unit 106 can properly identify the error position, the error-position identifying unit 106 detects an error at the insertion position. Therefore, when the error-position identifying unit 106 identifies the error position, the error-position identifying unit 106 notifies the determining unit 108 of the error position, so that the error position is compared with the insertion position. The data and data about the error position are also output to the error correcting unit 107.

When the determining unit 108 is notified of the error position, the determining unit 108 compares the error position with the insertion position that is notified by the dummy-error inserting unit 105 (Step S108). If the error position matches the insertion position (Yes at Step S108), the determining unit 108 determines that the error-position identifying unit 106 is normal, and therefore the validity of the error correcting circuit is guaranteed. The determining unit 108 then issues a command to the error correcting unit 107 to continue the error correction.

The error correcting unit 107 inverts a bit at the error position in the data received from the error-position identifying unit 106, thereby correcting the error in the data (Step S109). The error correcting unit 107 outputs the corrected data to the command processing unit 300 via the connecting unit 101. Thus, the reading process in response to the read command is completed.

If the error position does not match the insertion position (No at Step S108), the determining unit 108 determines that the error-position identifying unit 106 is abnormal, and therefore the error correction performed by the error correcting circuit can cause further errors in the data. The determining unit 108 outputs information indicative of a failure of the error correcting circuit to the command processing unit 300 via the connecting unit 101, so that the command processing unit 300 is notified of the error correcting circuit being abnormal (Step S110). Because the command processing unit 300 is notified of the error correcting circuit being abnormal, it is possible to automatically repair the error correcting circuit, or notify a user of the error correcting circuit being abnormal. Thus, the reliability of the RAS control can be improved.

Figure 4:
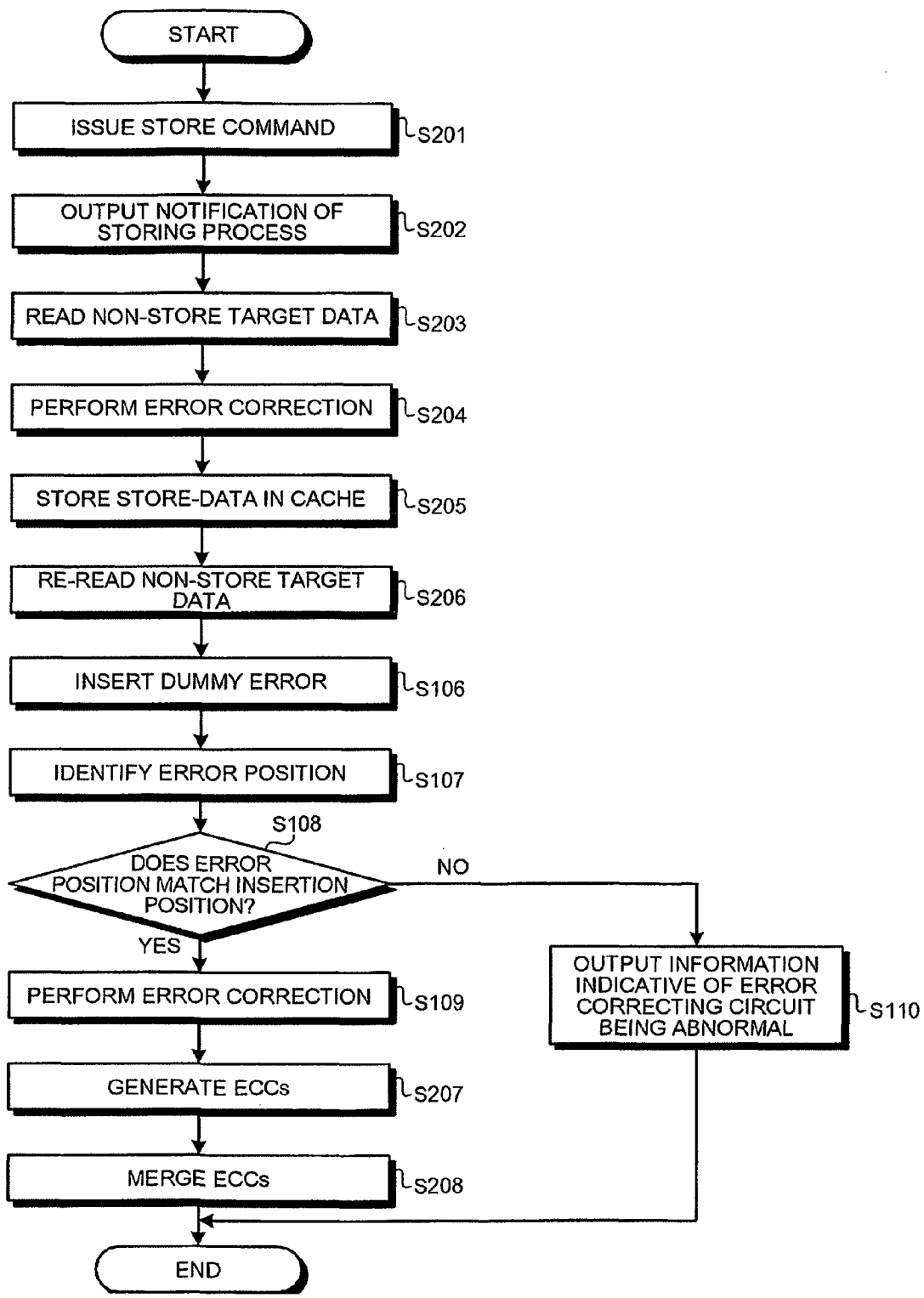
FIG. 4 is a flowchart of a storing process performed by the cache control unit.

FIG. 4 is a flowchart of the storing process performed by the cache control unit 100. The same steps as those in FIG. 3 are denoted by the same reference numeral in FIG. 4, and detailed descriptions thereof are omitted.

When the command processing unit 300 issues the store command to the cache control unit 100 (Step S201), the store command is input to the read commanding unit 102 via the connecting unit 101. The read commanding unit 102 notifies the reading unit 104 of an address of the non-store target data. The read commanding unit 102 notifies the counting unit 103 that the storing process is to be performed (Step S202).

The reading unit 104 reads the non-store target data at the address from the cache 200 (Step S203). When the counting unit 103 is notified that the storing process is to be performed, the counting unit 103 issues a command to the dummy-error inserting unit 105 to insert a dummy error in the non-store target data at the second reading operation in the storing process. In other words, the dummy-error inserting unit 105 does not insert a dummy error in the non-store target data read by the reading unit 104 at this time (the first reading operation). The error-position identifying unit 106 then identifies an error position in the non-store target data. The error correcting unit 107 inverts a bit at the identified error position, thereby performing the error correction (Step S204).

When it is confirmed that the non-store target data contains no error in the process of the error correction performed by the error correcting circuit, the store-data acquiring unit 111 acquires the store data from the connecting unit 101. The store-data acquiring unit 111 outputs the store data and the store command to the writing unit 112. Then, the writing unit 112 stores the store data in the cache 200 (Step S205). The store-data acquiring unit 111 also outputs the store data to the ECC generating unit 109.

When the writing unit 112 completes storing the store data in the cache 200, the reading unit 104 re-reads the non-store target data from the cache 200 (Step S206). The reading unit 104 then outputs the non-store target data to the dummy-error inserting unit 105. Because the non-store target data has been read by the second reading operation, the dummy-error inserting unit 105 inserts a dummy error in the non-store target data (Step S106). The dummy-error inserting unit 105 notifies the determining unit 108 of an insertion position in which the dummy-error inserting unit 105 inserts the dummy error.

The error-position identifying unit 106 then identifies an error position at which an error occurs in the non-store target data by using the ECC (Step S107). The error-position identifying unit 106 then notifies the determining unit 108 and the error correcting unit 107 of the error position. When the determining unit 108 is notified of the error position, the determining unit 108 compares the error position with the insertion position that is notified by the dummy-error inserting unit 105 (Step S108). If the error position matches the insertion position (Yes at Step S108), the determining unit 108 determines that the error-position identifying unit 106 is normal, and therefore the validity of the error correcting circuit is guaranteed. The determining unit 108 then issues a command to the error correcting unit 107 to continue the error correction.

The error correcting unit 107 inverts a bit at the error position in the non-store target data received from the error-position identifying unit 106, thereby correcting the error in the non-store target data (Step S109). The corrected non-store target data is output from the error correcting unit 107 to the ECC generating unit 109.

Thus, the store data and the non-store target data are input to the ECC generating unit 109. The ECC generating unit 109 generates the ECC of each of the store data and the non-store target data (Step S207). The ECC merging unit 110 then merges the ECC of the store data and the ECC of the non-store target data (Step S208), thereby obtaining an ECC of the data on which the storing process has been performed. The writing unit 112 then writes the ECC of the data in the ECC RAM included in the cache 200. Thus, the storing process in response to the store command and the update of the ECC in accordance with the storing process are completed.

If the error position does not match the insertion position (No at Step S108), the determining unit 108 determines that the error-position identifying unit 106 is abnormal, i.e., the error correcting circuit causes further errors in the non-store target data, and the ECC cannot be properly generated. Therefore, the determining unit 108 outputs information indicative of a failure of the error correcting circuit to the command processing unit 300 via the connecting unit 101, so that the command processing unit 300 is notified of the error correcting circuit being abnormal (Step S110). Because the command processing unit 300 is notified of the error correcting circuit being abnormal, it is possible to automatically repair the error correcting circuit, or notify a user of the error correcting circuit being abnormal. Thus, the reliability of the RAS control can be improved.

In the embodiment, as described above, the dummy error is inserted in the data read from the cache 200 each time the predetermined number of the read commands is issued, or each time the store command is issued. The error correcting circuit identifies an error position in the data in which the dummy error is inserted. Then, it is determined whether the identified error position matches the insertion position of the dummy error. If the error position matches the insertion position, the error correcting circuit is determined to be normal. On the other hand, if the error position does not match the insertion position, the error correcting circuit is determined to be abnormal. In this manner, it is possible to regularly verify the validity of the error correcting circuit in a secure manner, and to guarantee that the RAS control properly functions.

In the embodiment, the dummy error is inserted in the data that is read from the cache memory. However, it can be configured such that the dummy error is inserted in data that is read from other various memories to verify the validity of the error correcting circuit.

Furthermore, if the cache memory is configured by, for example, a set-associative cache including a plurality of ways, the dummy error can be inserted in a specific way from among the ways.

According to an aspect of the present invention, it is possible to regularly verify whether the error correcting circuit is normal in a secure manner, and to guarantee that the RAS control properly functions.

Furthermore, it is possible to regularly verify whether the error correcting circuit is normal even if operation of storing data in the memory is not performed, and operation of reading data from the memory is continuously performed.

Moreover, a dummy error can be inserted in the data in a secure manner.

Furthermore, it is possible to automatically repair the error correcting circuit, or notify a user of the error correcting circuit being abnormal. Thus, the reliability of the RAS control can be improved.

Moreover, the error position can be identified in the data in a secure manner.

Furthermore, it is possible to obtain error-free data.

Moreover, it is possible to secure that the error correction is properly performed on the non-store target data.

Furthermore, the error correcting code can be properly updated.

Moreover, even if a set-associative cache is used, it is possible to regularly verify whether the error correcting circuit is normal in a secure manner, and to guarantee that the RAS control properly functions.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A memory control apparatus that controls input and output of data in a memory, the memory control apparatus comprising:
   a reading unit that reads data from the memory;
   an inserting unit that inserts a dummy error at an insertion position in the data thereby obtaining error data;
   an identifying unit that identifies an error position at which an error has occurred in the error data;
   a determining unit that determines whether the insertion position matches the error position; and
   an outputting unit that, when the insertion position matches the error position, outputs corrected data that is obtained by correcting an error at the error position in the error data.

2. The memory control apparatus according to claim 1, further comprising a counting unit that counts number of times that the reading unit reads data from the memory, wherein
   the inserting unit inserts the dummy error in the data when a count of the counting unit reaches a threshold, and
   the counting unit resets the count when the count reaches the threshold.

3. The memory control apparatus according to claim 1, wherein the inserting unit inverts a predetermined bit in the data thereby obtaining the error data.

4. The memory control apparatus according to claim 1, wherein the identifying unit is included in an error correcting circuit, the memory control apparatus further comprising a notifying unit that outputs notification of a failure of the error correcting circuit for a user when the determining unit determines that the insertion position does not match the error position.

5. The memory control apparatus according to claim 1, wherein the identifying unit identifies the error position by using an error correcting code that is added to the data.

6. The memory control apparatus according to claim 1, wherein the outputting unit includes an error correcting unit that corrects the error by inverting a bit at the error position.

7. The memory control apparatus according to claim 1, wherein the reading unit reads non-store target data from the memory when a storing process is performed, wherein the storing process is performed to overwrite a part of data stored in the memory with new data, and the non-store target data is not overwritten by the storing process.

8. The memory control apparatus according to claim 7, wherein
   the reading unit reads the non-store target data from the memory twice in the storing process, and
   the inserting unit inserts the dummy error in the non-store target data when the reading unit reads the non-store target data at second time in the storing process.

9. The memory control apparatus according to claim 7, further comprising:
   a generating unit that generates an error correcting code of each of the non-store target data output by the outputting unit and store data that is to be written in the memory;
   a merging unit that merges the error correcting code of the non-store target data and the error correcting code of the store data, thereby obtaining a merged error correcting code; and
   a writing unit that writes the merged error correcting code in the memory.

10. The memory control apparatus according to claim 1, wherein
    the memory includes a plurality of ways, and
    the inserting unit inserts the dummy error in data in any one of the ways.

11. A memory control method that controls input and output of data in a memory, the memory control method comprising:
    reading data from the memory;
    inserting a dummy error at an insertion position in the data thereby obtaining error data;
    identifying an error position at which an error has occurred in the error data;
    determining whether the insertion position matches the error position; and
    outputting, when the insertion position matches the error position, corrected data that is obtained by correcting an error at the error position in the error data.

* * * * *